(12) United States Patent
Ju et al.

(10) Patent No.: US 10,381,771 B2
(45) Date of Patent: Aug. 13, 2019

(54) CONNECTOR ASSEMBLY

(71) Applicant: LOTES CO., LTD, Keelung (TW)

(72) Inventors: Ted Ju, Keelung (TW); Chin Chi Lin, Keelung (TW)

(73) Assignee: LOTES CO., LTD., Keelung (TW)

( * ) Notice: Subject to any disclaimer, the term of this patent is extended or adjusted under 35 U.S.C. 154(b) by 0 days.

(21) Appl. No.: 16/036,002

(22) Filed: Jul. 16, 2018

(65) Prior Publication Data

US 2019/0020145 A1   Jan. 17, 2019

(30) Foreign Application Priority Data

Jul. 14, 2017 (CN) .................. 2017 2 0851265 U

(51) Int. Cl.

| | |
|---|---|
| H01R 13/506 | (2006.01) |
| H01R 13/642 | (2006.01) |
| H05K 7/20 | (2006.01) |
| H01R 13/66 | (2006.01) |
| H01R 24/60 | (2011.01) |
| H01R 13/6471 | (2011.01) |
| H01R 13/6582 | (2011.01) |

(52) U.S. Cl.
CPC ......... *H01R 13/506* (2013.01); *H01R 13/642* (2013.01); *H01R 13/6658* (2013.01); *H01R 24/60* (2013.01); *H05K 7/2039* (2013.01); *H01R 13/6471* (2013.01); *H01R 13/6582* (2013.01)

(58) Field of Classification Search
CPC ............................ H01R 13/506; H01R 13/642; H01R 13/6658; H01R 13/6471; H01R 13/6582; H01R 24/60; H05K 7/2039
USPC ................................................ 439/485–487
See application file for complete search history.

(56) References Cited

U.S. PATENT DOCUMENTS 5,946,191 A * 8/1999 Oyamada ........... H05K 7/20672
165/104.14
6,674,643 B2 * 1/2004 Centola .............. H05K 7/20672
165/104.33

(Continued)

FOREIGN PATENT DOCUMENTS

CN 104733956 A 6/2015
CN 105610015 A 5/2016

*Primary Examiner* — Edwin A. Leon
*Assistant Examiner* — Oscar C Jimenez
(74) *Attorney, Agent, or Firm* — Locke Lord LLP; Tim Tingkang Xia, Esq.

(57) ABSTRACT

A connector assembly includes a socket connector and a plug connector. The socket connector includes a main body having a tongue; multiple mating terminals having multiple first contact portions; a shell surrounding the tongue to form an accommodating cavity; and a first thermal conduction member. The first contact portions are exposed from at least one first surface of the tongue and are arranged in a left-right direction. The first thermal conduction member has a first mating portion accommodated in the accommodating cavity, and the first mating portion and the tongue are provided at intervals in the left-right direction. The plug connector includes a circuit board; a chip, provided on the circuit board; a mating joint having an insulating body and multiple conductive terminals provided on the insulating body; and a second thermal conduction member having a second mating portion and a conducting portion thermally conducted with the chip.

20 Claims, 11 Drawing Sheets

(56) References Cited

U.S. PATENT DOCUMENTS

| | | | |
|---|---|---|---|
| 7,286,346 B2* | 10/2007 | Chiba | G06F 1/1632 165/104.33 |
| 2012/0052720 A1* | 3/2012 | David | H01R 13/6471 439/487 |
| 2016/0033198 A1* | 2/2016 | Hsiao | F26B 3/28 439/485 |
| 2016/0197424 A1* | 7/2016 | L'Esperance | H01R 12/721 439/61 |
| 2018/0337476 A1* | 11/2018 | Guy Ritter | H01R 13/6587 |
| 2019/0006802 A1* | 1/2019 | Ju | H01R 24/78 |
| 2019/0021185 A1* | 1/2019 | Ju | H01R 12/724 |

* cited by examiner

CONNECTOR ASSEMBLY

CROSS-REFERENCE TO RELATED PATENT APPLICATION

This non-provisional application claims priority to and the benefit of, pursuant to 35 U.S.C. § 119(a), patent application Serial No. CN201720851265.1, filed in China on Jul. 14, 2017. The disclosures of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a connector assembly, and more particularly to a connector assembly having a thermal conduction member.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A commonly used plug connector in the industry includes a circuit board, a mating joint electrically connected to one end of the circuit board, a cable electrically connected to the other end of the circuit board, and a metal shell covering a rear end of the mating joint and outside of the circuit board. Currently, due to the increasingly powerful functions of electronic devices, the signal transmission requirements on plug connectors are also increasing. In order to enable the plug connector to have greater data transmission bandwidth and the ability to transmit uncompressed audio signals and high resolution video signals, a chip is generally installed on the circuit board to enhance the decoding capability of the plug connector. However, it is well-known that, as the chip speed becomes faster and the required power is also increased, the chip will generate a lot of heat during operation. If the heat is not dissipated in time, the chip will become too hot and fail, and the plug connector will be damaged, resulting in failure of the entire electronic device.

In order to solve this problem, the metal shell is provided with an abutting portion, which elastically abuts the chip, such that the heat generated by the chip is transferred to the metal shell, and then heat exchange is performed with the outside air through the metal shell to achieve the purpose of heat dissipation. However, due to the low thermal conductivity of the metal shell, the heat transfer rate is slow, such that the heat generated by the chip cannot be quickly dissipated, resulting in poor heat dissipation effect, and affecting the reliability of the signal transmission of the plug connector.

Therefore, a heretofore unaddressed need to design a novel connector assembly exists in the art to address the aforementioned deficiencies and inadequacies.

SUMMARY

The invention is directed to a connector assembly having thermal conduction members, which can quickly dissipate heat generated by the chip inside the plug connector.

To achieve the foregoing objective, the present invention adopts the following technical solutions:

A connector assembly includes: a socket connector, including: a main body, having a tongue, wherein the tongue has two first surfaces provided opposite to each other; a plurality of mating terminals, provided on the main body, wherein each of the mating terminals has a first contact portion, and the first contact portions of the mating terminals are exposed from at least one of the first surface and are arranged in a left-right direction; a shell, provided outside the main body, the shell surrounding the tongue to define an accommodating cavity; and at least one first thermal conduction member, provided on the main body, wherein the first thermal conduction member has a first mating portion accommodated in the accommodating cavity, and the first mating portion and the tongue are provided at intervals in the left-right direction; and a plug connector, including: a circuit board; at least one chip, provided on the circuit board; a mating joint, electrically connected to one end of the circuit board, wherein the mating joint has an insulating body and a plurality of conductive terminals provided on the insulating body; and at least one second thermal conduction member, provided on the insulating body, wherein the second thermal conduction member has a second mating portion and a conducting portion, and the conducting portion is thermally conducted with the chip, wherein when the plug connector is inserted into the socket connector in a front-rear direction, the mating joint is at least partially inserted into the accommodating cavity, the first contact portions of the mating terminals are in contact with the conductive terminal to form an electrical connection, and the first mating portion is in contact with the second mating portion to form thermal conduction.

In certain embodiments, one of the first mating portion and the second mating portion has an accommodating slot for insertion of the other of the first mating portion and the second mating portion.

In certain embodiments, the one of the first mating portion and the second mating portion being provided with the accommodating slot also has at least one buckling elastic sheet protruding into the accommodating slot, and the other of the first mating portion and the second mating portion has at least one fastening slot configured to fasten the buckling elastic sheet.

In certain embodiments, each of the first contact portions and the first mating portion is flat plate shaped, each of the first contact portions has a mating surface configured to be in contact with one of the conductive terminals, and a distance between two of the mating surfaces vertically provided correspondingly is equal to a thickness of the first mating portion in a vertical direction.

In certain embodiments, the conducting portion protrudes out of a rear end of the insulating body, and is in contact with the chip to form the thermal conduction.

In certain embodiments, the plug connector is provided with two second mating portions, and the two second mating portions are vertically provided correspondingly and are in contact with the same first mating portion.

In certain embodiments, the two second mating portions vertically provided correspondingly are integrally formed with the same conducting portion.

In certain embodiments, the two second mating portions vertically provided correspondingly are provided on two second thermal conduction members.

In certain embodiments, a mating slot is backward concavely provided on a front end of the insulating body and configured to accommodate the tongue, each of the conductive terminals has a second contact portion, and the second contact portions of the conductive terminals and the second mating portion protrude into the mating slot respectively.

In certain embodiments, the second contact portions of the conducive terminals are provided in two rows at an upper side and a lower side of the mating slot, the second contact portions are located at one side of the second mating portion in the left-right direction, and the second mating portion is located between the two rows of the second contact portions in a vertical direction.

In certain embodiments, a front end of the second mating portion is located closer to the front end of the insulating body than a front end of each of the second contact portions.

In certain embodiments, the plug connector further includes a latch arm located at a left side or a right side of the mating slot, the latch arm has a latch portion protruding into the mating slot, the second mating portion and the latch portion are located at the left side and the right side of the mating slot; and the socket connector further includes a middle shielding plate located between the two first surfaces, the middle shielding plate has a latch notch exposed from a left side or a right side of the tongue, and the latch portion is configured to be buckled to the latch notch.

In certain embodiments, the socket connector is provided with two first mating portions respectively at a left side and a right side of the tongue, the two first mating portions are symmetrical about a center of the accommodating cavity at 180 degrees, and the plug connector is correspondingly provided with two second mating portions in contact with the two first mating portions.

In certain embodiments, the tongue is formed by a printed circuit board (PCB), and each of the first contact portions is an electrical conduction trace on the PCB.

In certain embodiments, the plug connector further includes a shielding shell provided outside the insulating body, and the second mating portion is accommodated in the shielding shell.

In certain embodiments, the plug connector further includes a shielding cover provided at a rear end of the shielding shell, the circuit board is located in the shielding cover, and the shielding cover has an abutting portion in contact with the chip or the conducting portion.

In certain embodiments, a width of the first mating portion in the left-right direction is twice or more than twice a width of each of the first contact portions in the left-right direction.

In certain embodiments, at least one of the first thermal conduction member and the second thermal conduction member is a thermal transistor or a capillary.

In certain embodiments, the mating terminals are provided in two rows at an upper side and a lower side of the tongue, the conductive terminals are provided in two rows on the insulating body, and each of the rows of mating terminals and each of the rows of conductive terminals respectively include, sequentially from left to right: a ground terminal, a pair of differential signal terminals for transmitting universal serial bus (USB) 3.0 signals, a power terminal, a reserved terminal, a pair of USB 2.0 terminals, a reserved terminal, a power terminal, a pair of differential signal terminals for transmitting USB 3.0 signals, and a ground terminal.

In certain embodiments, the socket connector is mounted on a main board and exposed from one side of a casing, the main board is located in the casing, a heat dissipating device is provided in the casing, the at least one first thermal conduction member has a heat dissipating portion protruding out of the socket connector, and the heat dissipating device is configured for dissipating heat from the heat dissipating portion.

Compared with the related art, in certain embodiments of the present invention, the first contact portions on the first surface of the tongue are arranged in the left-right direction, and the shell surrounds the tongue to define the accommodating cavity. The first thermal conduction member is provided on the socket connector. The first thermal conduction member has the first mating portion which is provided at intervals with the tongue in the left-right direction, and the first mating portion is accommodated in the accommodating cavity. The plug connector is provided with the second thermal conduction member, and the second thermal conduction member is provided with the second mating portion and the conducting portion thermally conducted with the chip inside the plug connector. When the plug connector is inserted into the socket connector along the front-rear direction, the first contact portions are in contact with the conductive terminal to form an electrical connection, and the second mating portion is in contact with the second mating portion to form thermal conduction. Thus, heat generated by the chip is transferred to the first thermal conduction member through the second thermal conduction member, such that the heat generated by the chip can be quickly dissipated from the inside of the plug connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
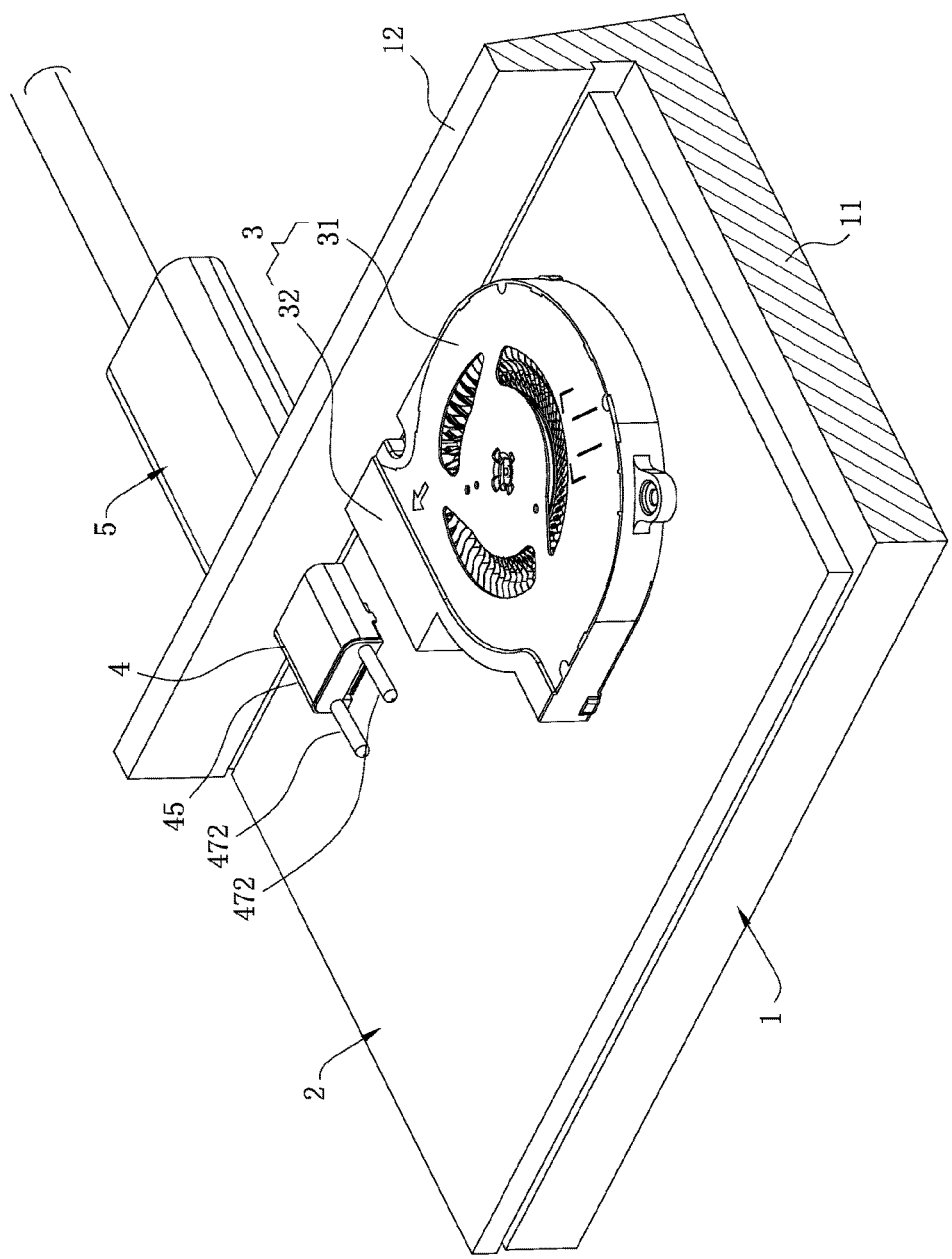
FIG. 1 is a perspective view of a connector assembly according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-11. In accordance with the purposes of this invention, as embodied and broadly described herein, this invention, in one aspect, relates to a connector assembly.

Referring to FIG. 1 to FIG. 5, a connector assembly according to a first embodiment of the present invention is provided. The connector assembly includes a socket connector 4 and a plug connector 5. The socket connector 4 is mounted on a main board 2 in a casing 1. The socket connector 4 is mounted on the main board 2 in a sunken board manner and is electrically connected to the main board 2. A heat dissipating device 3 is also mounted in the casing 1, and the heat dissipating device 3 is adjacent to the socket connector 4. The socket connector 4 and the plug connector 5 may be mated forwardly or reversely in a front-rear direction. The connector assembly also defines a left-right direction and a vertical direction. The front-rear direction, the left-right direction and the vertical direction are perpendicular to each other in pairs.

Figure 4:
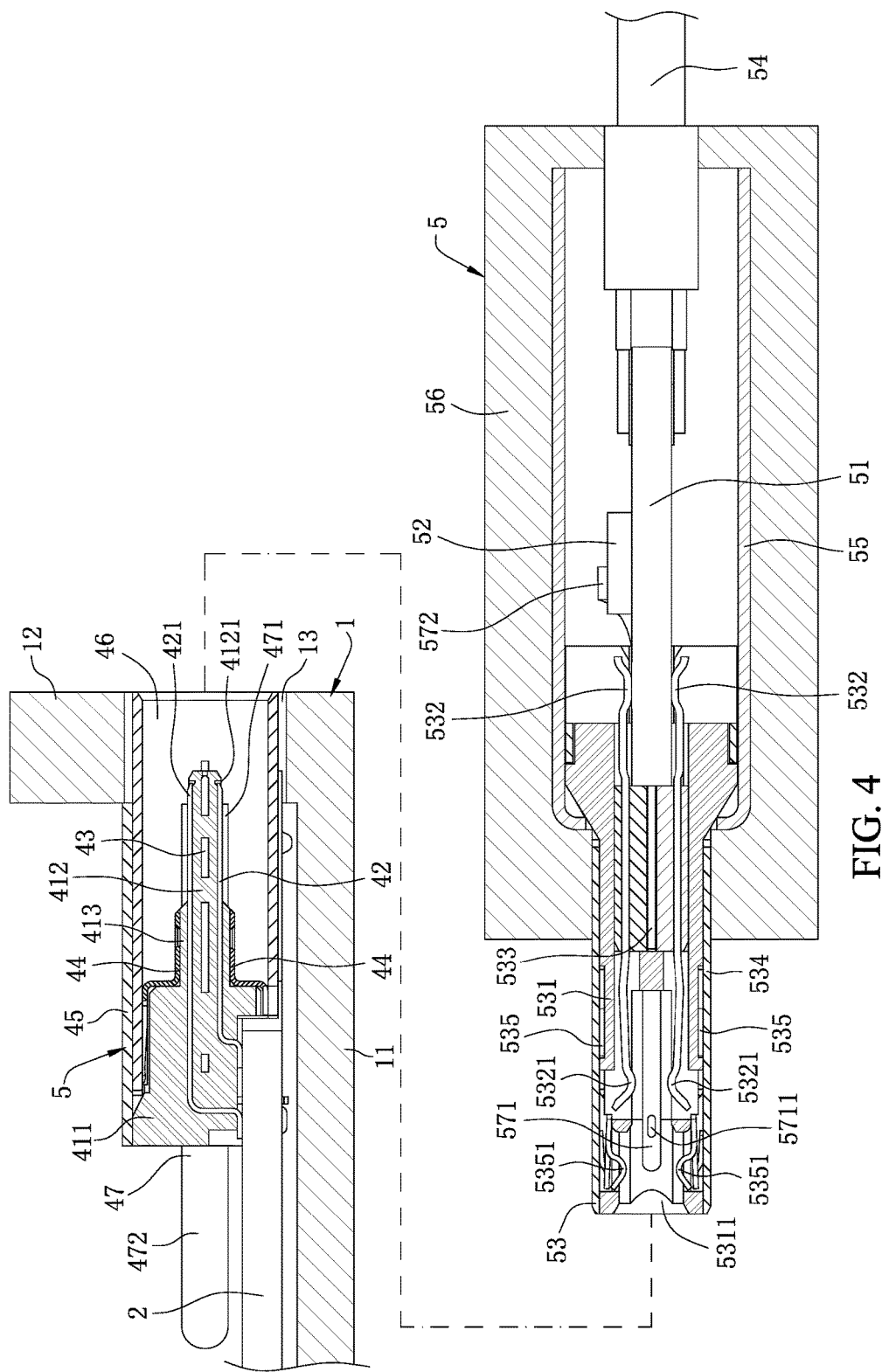
FIG. 4 is another sectional view of FIG. 1 before a plug connector is inserted into a socket connector.

Referring to FIG. 1 and FIG. 4, the casing 1 may be a shell of a portable computer, or may be desktop computer mainframe box. Of course, the casing 1 may also be a shell of other types of electronic devices or the like. The casing 1 may be made of a plastic material or metal material. In this embodiment, the casing 1 is made of a plastic material. The casing 1 has a bottom wall 11 and multiple side walls 12 extending upward from the bottom wall 11. The main board 2 is mounted on the bottom wall 11, and one of the side walls 12 is provided with an opening 13 communicating with outside. The socket connector 4 is partially exposed from the opening 13.

Referring to FIG. 1, in this embodiment, the heat dissipating device 3 is mounted on the main board 2. The heat dissipating device 3 is a fan. The heat dissipating device 3 has a fan body 31 and an air outlet 32 connected to the fan body 31, and the air outlet 32 directly faces the socket connector 4. In other embodiments, the heat dissipating device 3 may also be mounted on another component or device in the casing 1, or the heat dissipating device 3 may also be mounted on the casing 1.

Figure 3:
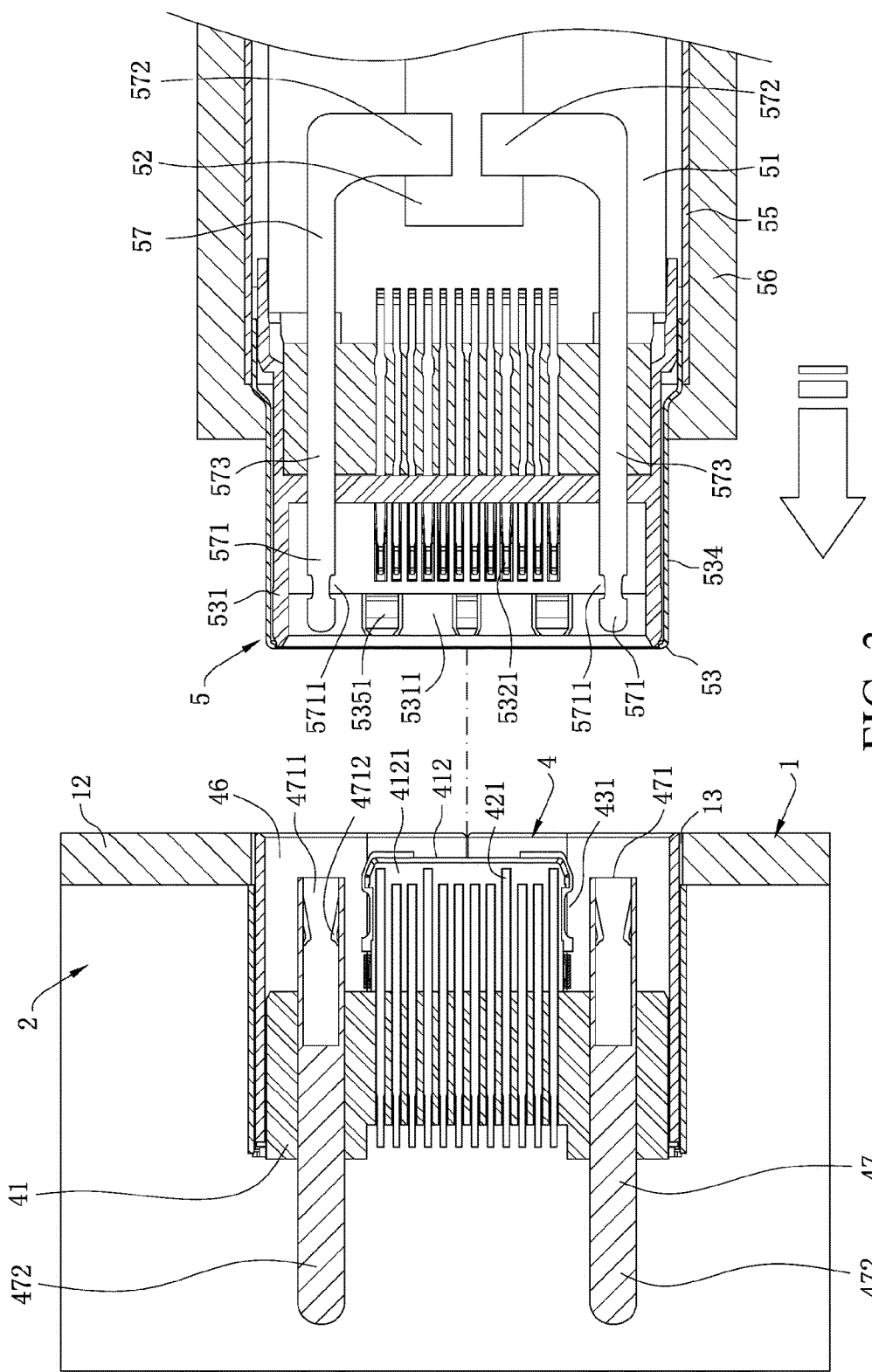
FIG. 3 is a sectional view of FIG. 1 before a plug connector is inserted into a socket connector.

Referring to FIG. 3 and FIG. 4, the socket connector 4 includes a main body 41, multiple mating terminals 42, a middle shielding plate 43, two grounding members 44, a shell 45 and two first thermal conduction members 47. In this embodiment, the main body 41 is made of an insulating material. The main body 41 has a base 411, a tongue 412 located at one end of the base 411 and a step portion 413 provided between the base 411 and the tongue 412. The base 411, the step portion 413 and the tongue 412 are sequentially provided in the front-rear direction. The tongue 412 has two first surfaces 4121 provided vertically opposite to each other. The mating terminals 42 are provided in upper and lower rows on the main body 41, and the mating terminals 42 in each row include, sequentially from left to right, a grounding terminal, a pair of differential signal terminals (high-speed terminals) for transmitting USB 3.0 signals, a power terminal, a reserved terminal, a pair of USB 2.0 terminals, a reserved terminal, a power terminal, a pair of differential signal terminals (high-speed terminals) for transmitting USB 3.0 signals and a grounding terminal. Each of the mating terminals 42 has a first contact portion 421 which is flat plate shaped, and the first contact portions 421 of the mating terminals 42 are provided correspondingly in two rows. The two rows of first contact portions 421 are correspondingly exposed from the two first surfaces 4121 of the tongue 412, and the first contact portions 421 on each of the first surfaces 4121 are provided in the left-right direction side by side. The middle shielding plate 43 is located between the two first surfaces 4121. That is, the middle shielding plate 43 is located between the two rows of the first contact portions 421. The left and right sides of the middle shielding plate 43 correspondingly protrude out of the left and right sides of the tongue 412. The middle shielding plate 43 further has two latch notches 431 respectively exposed from the left and right sides of the tongue 412. The two grounding members 44 are provided on the opposite upper and lower surfaces of the step portion 413, and the two grounding members 44 are buckled with each other on the left and right sides of the step portion 413. The grounding members 44 are in contact with the shell 45. In the present embodiment, the shell 45 is made of a metal material. The shell 45 is sleeved over the main body 41, and the shell 45 surrounds the tongue 412 to define a accommodating cavity 46. The two rows of first contact portions 421 are symmetrical about a center of the accommodating cavity 46 at 180 degrees. In another embodiment, the tongue 412 may be formed from a PCB, and the base 411 is also made of an insulating plastic material and fixes the PCB. The first contact portions 421 are electrical conduction traces on the PCB. Thus, multiple conversion terminals are correspondingly connected to the electrical conduction traces on the PCB, and the conversion terminals are connected to the main board 2 simultaneously. In a yet another embodiment, the shell 45 may also be made of an insulating plastic material.

Referring to FIG. 3 and FIG. 4, the first thermal conduction members 47 have favorable thermal conductivity. The thermal conductivity of the first thermal conduction members 47 is higher than the thermal conductivity of the metal shell 45. The first thermal conduction members 47 are provided on the main body 41, and the first thermal conduction members 47 extend in the front-rear direction. The two first thermal conduction members 47 are located at the left and right sides of the tongue 412. Each of the first thermal conduction members 47 has at least one first mating portion 471 and a heat dissipating portion 472, and the first mating portion 471 and the heat dissipating portion 472 are located on two opposite ends of each first thermal conduction member 47. The first mating portion 471 and the tongue 412 extend in the same direction of the base 411 and are provided at intervals in the left-right direction. The two first mating portions 471 are symmetrical about the center of the accommodating cavity 46 at 180 degrees. The first mating portion 471 has an accommodating slot 4711 and at least one buckling elastic sheet 4712 protruding into the accommodating slot 4711, and a width of each first mating portion 471 in the left-right direction is twice or more than twice the width of each first contact portion 421 in the left-right direction.

The heat dissipating portion 472 protrudes out of the main body 41 and is exposed outside the socket connector 4, or the heat dissipating portion 472 may also be in contact with a heat dissipating pattern on the main board 2 to form a thermal conduction. In the present embodiment, the first thermal conduction member 47 is a metal stamping member. Each of the first thermal conduction members 47 has one first mating portion 471 and one heat dissipating portion 472, and there are multiple buckling elastic sheets 4712, which are distributed around the accommodating slot 4711. Of course, in other embodiments, the first thermal conduction member 47 may be a metal lathe turning member.

Figure 2:
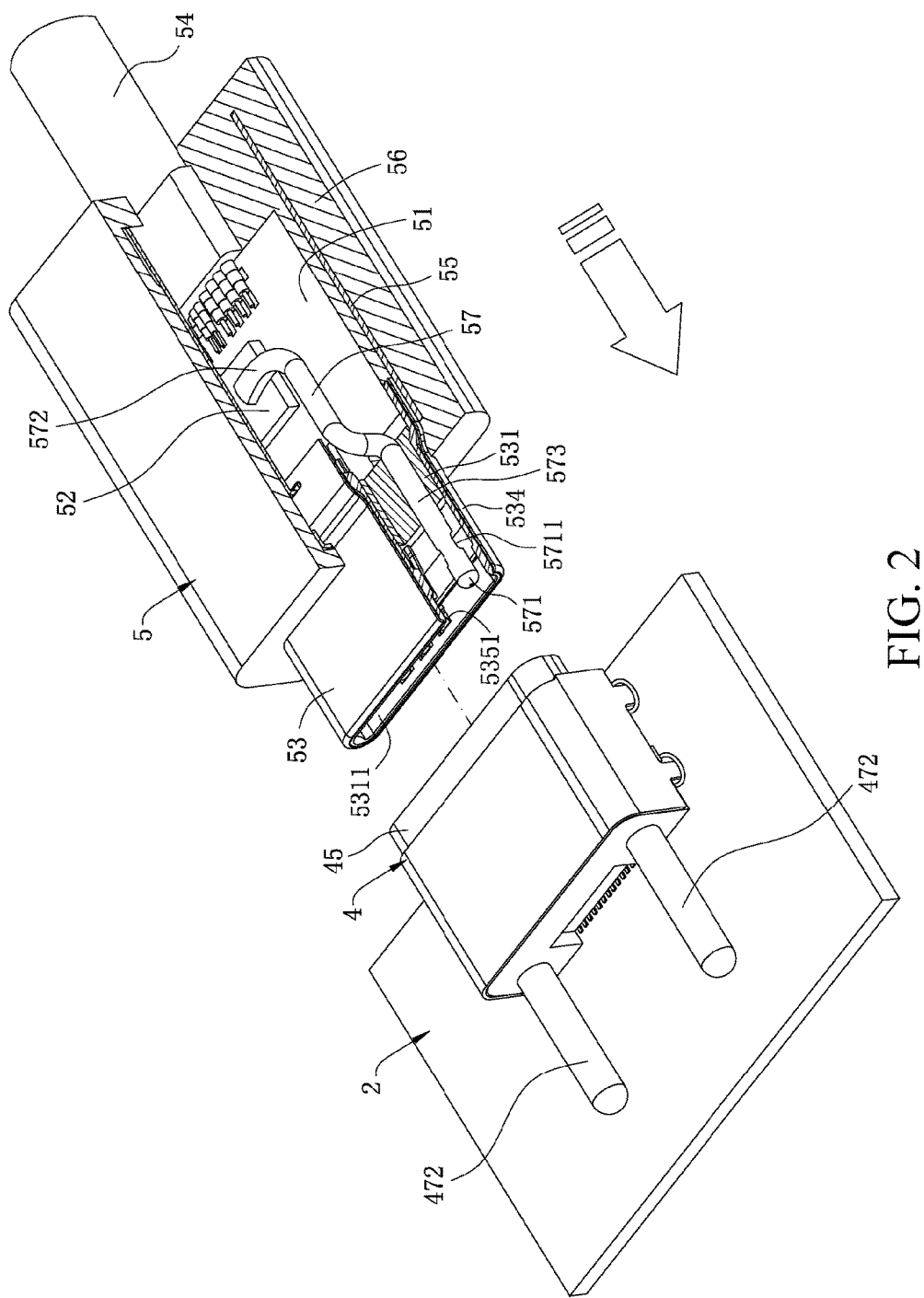
FIG. 2 is a local perspective sectional view of FIG. 1 before a plug connector is inserted into a socket connector.

Referring to FIG. 2 to FIG. 4, the plug connector 5 includes a circuit board 51, at least one chip 52 provided on the circuit board 51, a mating joint 53 electrically connected to one end of the circuit board 51, a cable 54 electrically connected to the other end of the circuit board 51, a shielding cover 55, an insulating shell 56, and two second thermal conduction members 57. The mating joint 53 has an insulating body 531, multiple conductive terminals 532 provided on the insulating body 531, a shielding member 533, a shielding shell 534 sleeved over the insulating body 1, and two grounding elastic sheets 535 provided on the upper and lower surfaces of the insulating body 1. A front end of the insulating body 531 is backward concavely provided with a mating slot 5311. The conductive terminals 532 are provided in two rows. Each row of conductive terminals 532 include, sequentially from left to right: a ground terminal, a pair of differential signal terminals (high-speed terminals) for transmitting USB 3.0 signals, a power terminal, a reserved terminal, a pair of USB 2.0 terminals, a reserved terminal, a power terminal, a pair of differential signal terminals (high-speed terminals) for transmitting USB 3.0 signals, and a ground terminal. The terminal transmission definitions of the two rows of conductive terminals 532 are set oppositely. Each of the conductive terminals 532 has a second contact portion 5321 protruding forward into the mating slot 5311, and the second contact portion 5321 is an elastic contact arm structure. The second contact portions 5321 of the conductive terminals 532 are provided in two rows on the upper and lower sides of the mating slot 5311, and the two rows of the second contact portions 5321 are symmetrical about the center of the mating slot 5311 at 180 degrees. The shielding member 533 is formed by blanking a metal sheet. The shielding member 533 has a body portion located between the two rows of the conductive terminals 532 and configured to shield signal interference between the two rows of the conductive terminals 532. The shielding shell 534 is a tubular structure seamlessly connected and formed by a drawing process. Each of the grounding elastic sheets 535 is sandwiched between the insulating body 1 and the shielding shell 534. Each of the grounding elastic sheets 535 has multiple grounding contacts 5351 protruding into the mating slot 5311, and the grounding contacts 5351 are located in front of the second contact portions 5321. The grounding elastic sheets 535 are in contact with the shielding shell 534 to form grounding. The shielding cover 55 is sleeved over a rear end of the shielding shell 534. The circuit board 51 is located in the shielding cover 55. The overlapped portions of the shielding cover 55 and the shielding shell 534 are fixed together by spot soldering, or may also be fixed to each other through a buckle structure. The insulating shell 56 covers the shielding cover 55 and the shielding shell 534. The mating joint 73 projects forward out of a front end of the insulating shell 56, and the shielding shell 534 also projects forward out of the front end of the insulating shell 56. In this embodiment, the insulating shell 56 is injection-molded outside of the shielding cover 55, the shielding shell 534 and the cable 54.

Figure 5:
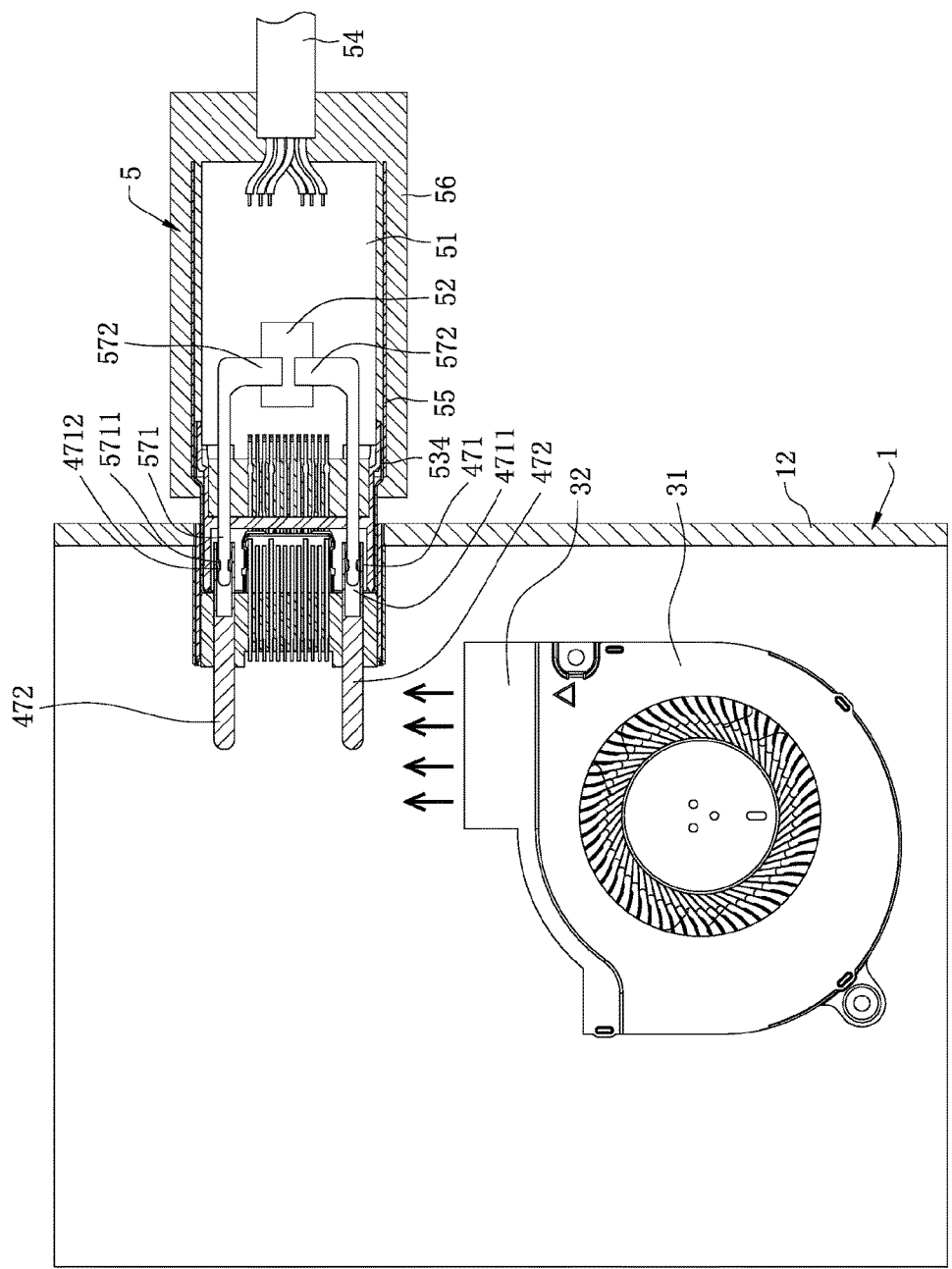
FIG. 5 is a sectional view of FIG. 1.
Figure 6:
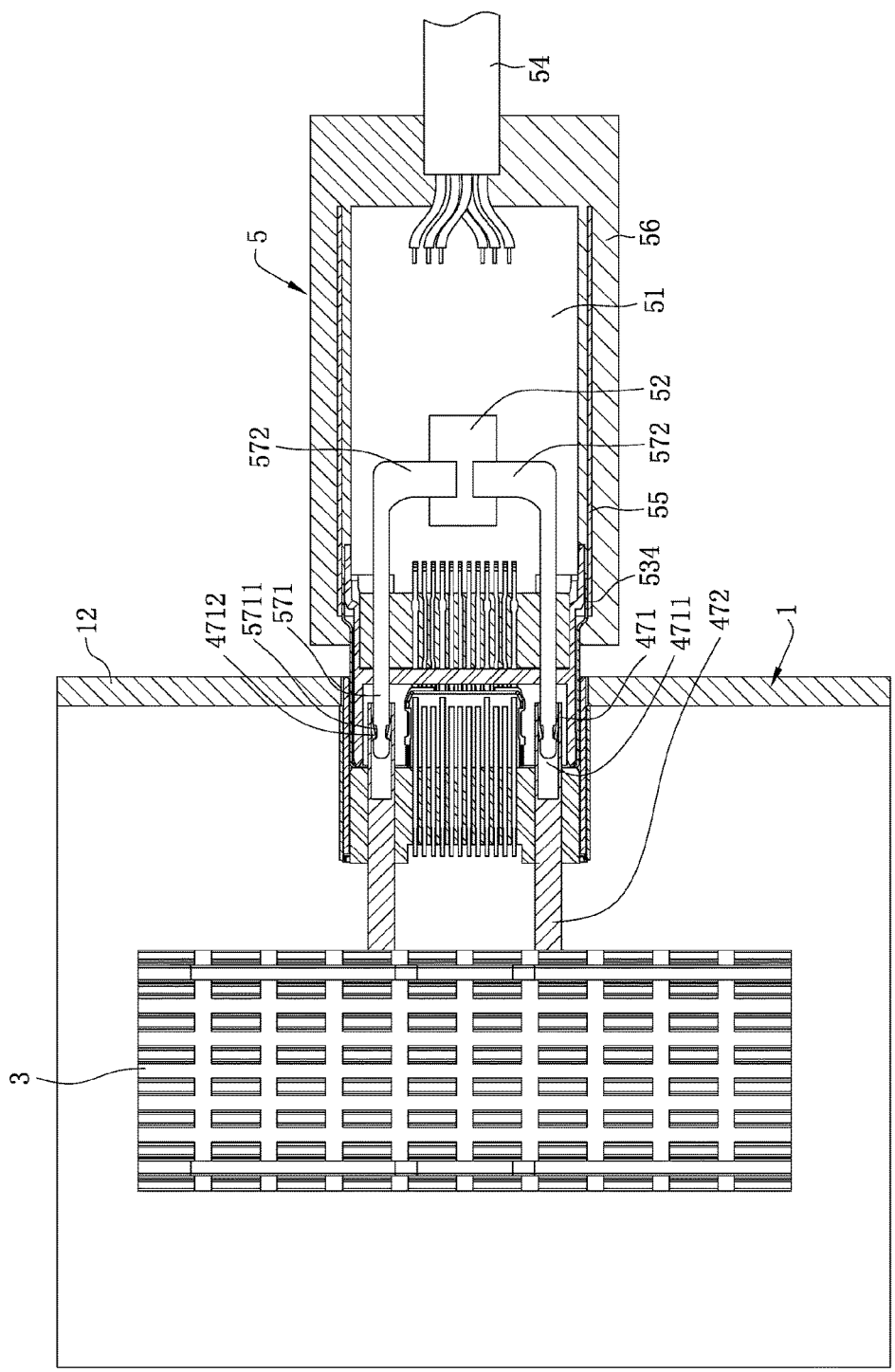
FIG. 6 is a schematic view of a connector assembly according to a second embodiment of the present invention.

Referring to FIG. 3, FIG. 5 and FIG. 6, as the increasingly higher signal transmission requirements on the plug connector 5 and the enhancement of the signal processing capacity, the chip 52 will generate abundant heat during operation. In order to enable the heat generated by the chip 52 inside the plug connector 5 to be well dissipated, the plug connector 5 is provided with the second thermal conduction members 57 having favorable thermal conductivity. The material of the second thermal conduction members 57 is different from the materials of the masking shell 55 and the shielding shell 534, and the thermal conductivity of the second thermal conduction members 57 is higher than the thermal conductivity of the masking shell 55 and the shielding shell 534. The second thermal conduction members 57 are provided on the insulating body 531 and accommodated in the shielding shell 534. The second thermal conduction members 57 extend in the front-rear direction. Each of the second thermal conduction members 57 is provided with a second mating portion 571, a conducting portion 572 and a connecting portion 573 connected between the second mating portion 571 and the conducting portion 572. The connecting portion 573 is fixedly provided on the insulating body 531. The second mating portion 571 protrudes forward into the mating slot 5311. A front end of the second mating portion 571 is located closer to the front end of the insulating body 531 than a front end of each second contact portion 5321. The second contact portions 5321 of the conductive terminals 532 are located between the two second mating portions 571 in the left-right direction, and the second mating portion 571 is located between the two rows of second contact portions 5321 in the vertical direction. The two second mating portions 571 are symmetrical about a center of the mating slot 5311 at 180 degrees, and a width of each second mating portion 571 in the left-right direction is twice or more than twice the width of each second contact portion 5321 in the left-right direction. The second mating portion 571 is provided with at least one fastening slot 5711 for fastening the buckling elastic sheet 4712. In the present embodiment, there are multiple fastening slots 5711 provided corresponding to the buckling elastic sheets 4712. Thermal conduction paste or another high-thermal-conductivity component may also be provided between the conducting portions 572 and the chip 52. In other embodiments, each second mating portion 571 has only one fastening slots 5711 surrounding the peripheral surface of the second mating portion 571. Of course, the fastening slot 5711 may be provided on the first mating portion 471, and the accommodating slot 4711 and the buckling elastic sheets 4712 are provided on the second mating portion 571.

Referring to FIG. 3 to FIG. 7, when the plug connector 5 moves toward the socket connector 4 in the front-rear direction, and when they are completely mated, the front end of the mating joint 53 is inserted into the accommodating cavity 46. At this time, the first contact portions 421 are in contact with the second contact portions 5321 to form an electrical connection, the grounding contact 5351 abuts the grounding member 44 to form a grounding path, and the shielding shell 534 is in contact with the metal shell 45 to form a grounding path. Meanwhile, the second mating portion 571 is inserted into the accommodating slot 4711, and they are in contact with each other to form a thermal conduction, such that the heat generated by the chip 52 is quickly transferred to the first thermal conduction member 47 through the second thermal conduction member 57. Further, the buckling elastic sheets 4712 are fastened to the fastening slots 5711, such that the first mating portion 471 and the second mating portion 571 are tightly fastened together, thus preventing the plug connector 5 and the socket connector 4 from disengaging from each other under the action of an external force. The fan body 31 in the casing 1 operates to drive air to flow quickly. Since the air outlet 32 directly faces the heat dissipating portion 472 and the shell 45, air flow around the heat dissipating portion 472 and the shell 45 may be accelerated to perform heat dissipation on the first thermal conduction members 47. If the heat dissipating portion 472 is in contact with the heat dissipating pattern, the air outlet 32 may also accelerate the air flow around the heat dissipating pattern, thereby increasing the heat dissipation area, and accelerating the heat dissipation. The heat dissipated into the casing 1 is then transferred to the outside air through the heat dissipation structure in the casing 1, such that the heat generated by the chip 52 may be dissipated as quickly as possible.

Referring to FIG. 6, a connector assembly according to a second embodiment of the present invention is provided. The connector assembly of the present embodiment has the same structure as the first embodiment described above, and will not be elaborated again. However, the difference exists in that the heat dissipating device 3 adopts a heat sink having multiple heat dissipating fins, and the heat dissipating portion 472 is connected to the heat dissipating device 3.

Figure 7:
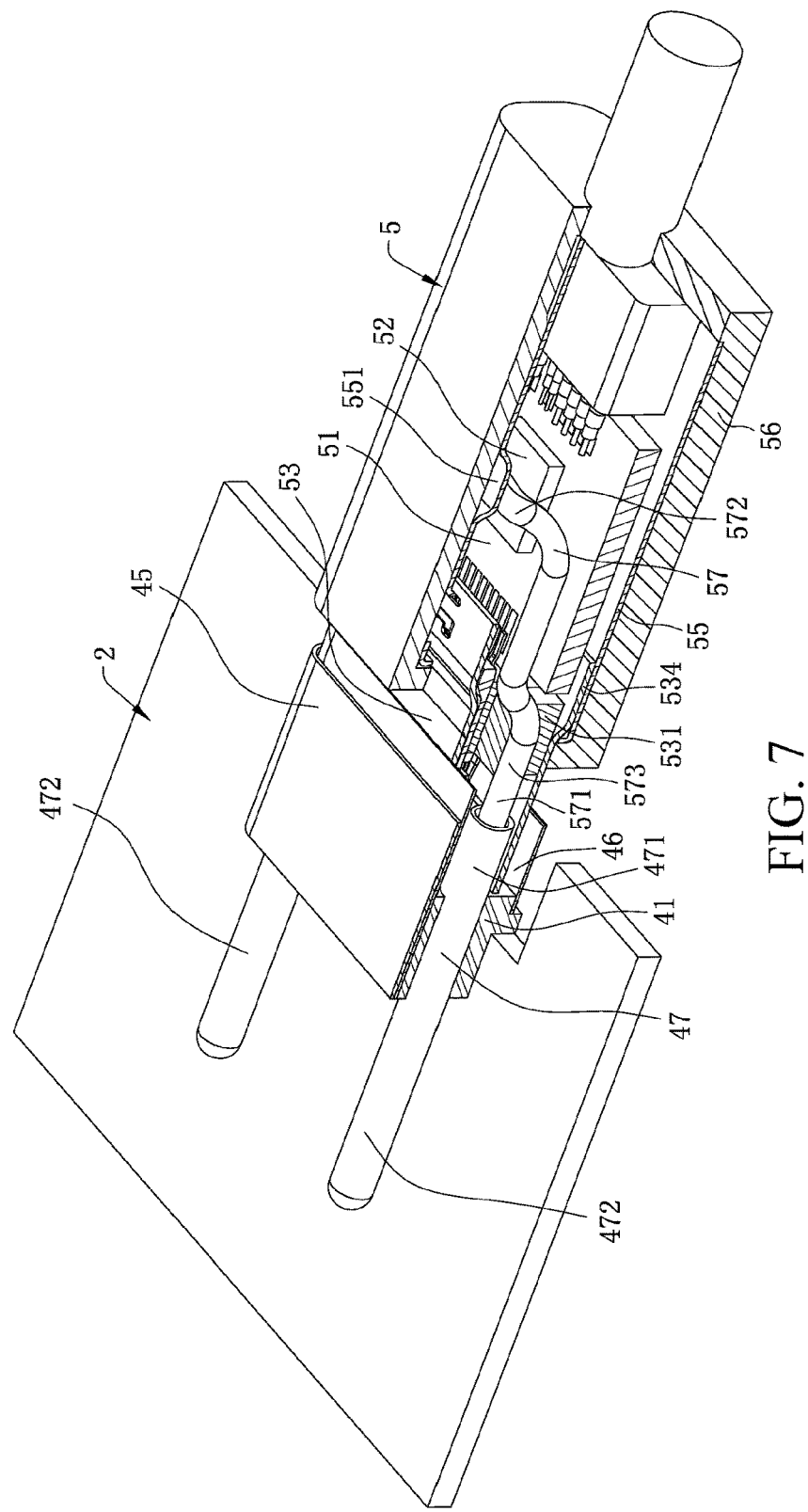
FIG. 7 is a schematic view of a connector assembly according to a third embodiment of the present invention.

Referring to FIG. 7, a connector assembly according to a third embodiment of the present invention is provided. The structure of the present embodiment is substantially similar to that of the first embodiment described above, and the same structures will not be elaborated again. The difference exists in that the shielding cover 55 is additionally provided with an abutting portion 551. The conducting portion 572 is also in contact with the chip 52, and the abutting portion 551 is in contact with the conducting portion 572. Thermal conduction paste or another high-thermal-conductivity component may be also provided between the abutting portion 551 and the chip 52. Thus, when the plug connector 5 is mated with the socket connector 4, a part of the heat generated by the chip 52 may also be transferred to the shell 45 made of a metal material through the shielding cover 55 and the shielding shell 534. The heat dissipating device 3 may accelerate the heat dissipation of the shell 45. Alternatively, the abutting portion 551 abuts the chip 52 while the conducting portion 572 is in contact with the chip 52 to form a thermal conduction. In other embodiments, it is also possible that the shielding shell 534 is provided with the abutting portion 551 abutting the chip 52, and the conducting portion 572 is in contact with the shielding shell 534.

Figure 8:
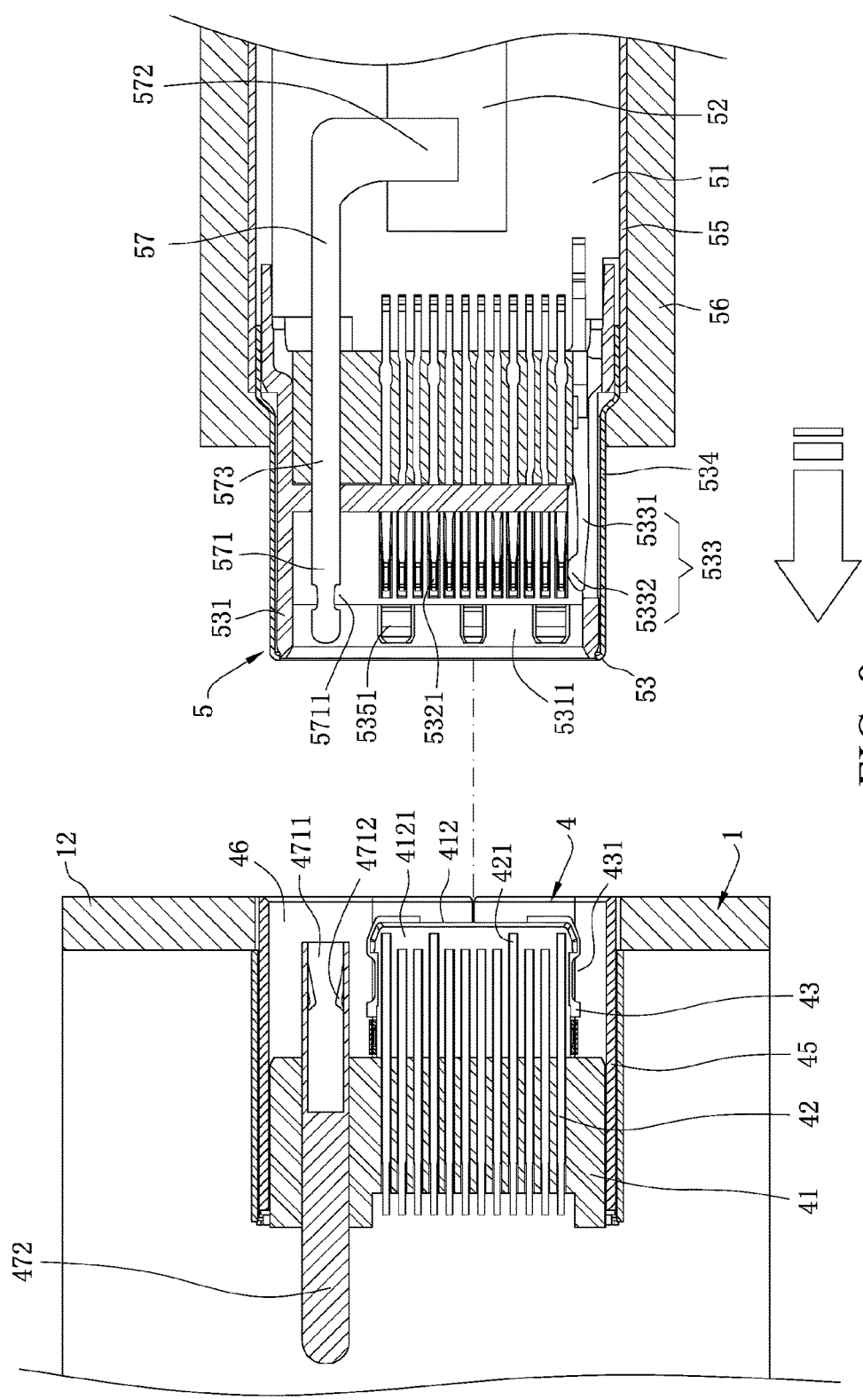
FIG. 8 is a schematic view of a connector assembly according to a fourth embodiment of the present invention.

Referring to FIG. 8, a connector assembly according to a fourth embodiment of the present invention is provided. The structure of the present embodiment is substantially similar to that of the first embodiment described above, and the same structures will not be elaborated again. The difference exists in that the socket connector 4 is provided with only one first thermal conduction member 47, and therefore, the first mating portion 471 is provided only on one side of the tongue 412. Correspondingly, the plug connector 5 is also provided with only one second thermal conduction member 57. In addition, the shielding member 533 has a latch arm 5331 located at one side of the body portion and extending forward. The latch arm 5331 is located at one side of the insulating body 531, and the latch arm 5331 has a latch portion 5332 protruding into the mating slot 5311. The latch portion 5332 is configured to be fastened to one of the two latch notches 431, and the second mating portion 571 and the latch portion 5332 are located on the left and right sides of the second contact portions 5321. Thus, when the plug connector 5 is mated with the socket connector 4, the latch portion 5332 and the second mating portion 571 are located on two opposite sides of the tongue 412. The latch portion 5332 is fastened to the one of the two latch notches 431 and the buckling elastic sheet 4712 is fastened to the fastening slot 5711, such that the plug connector 5 and the socket connector 4 are unlikely to disengage from each other during mating, so as to form a stable electrical connection and thermal conduction.

Figure 9:
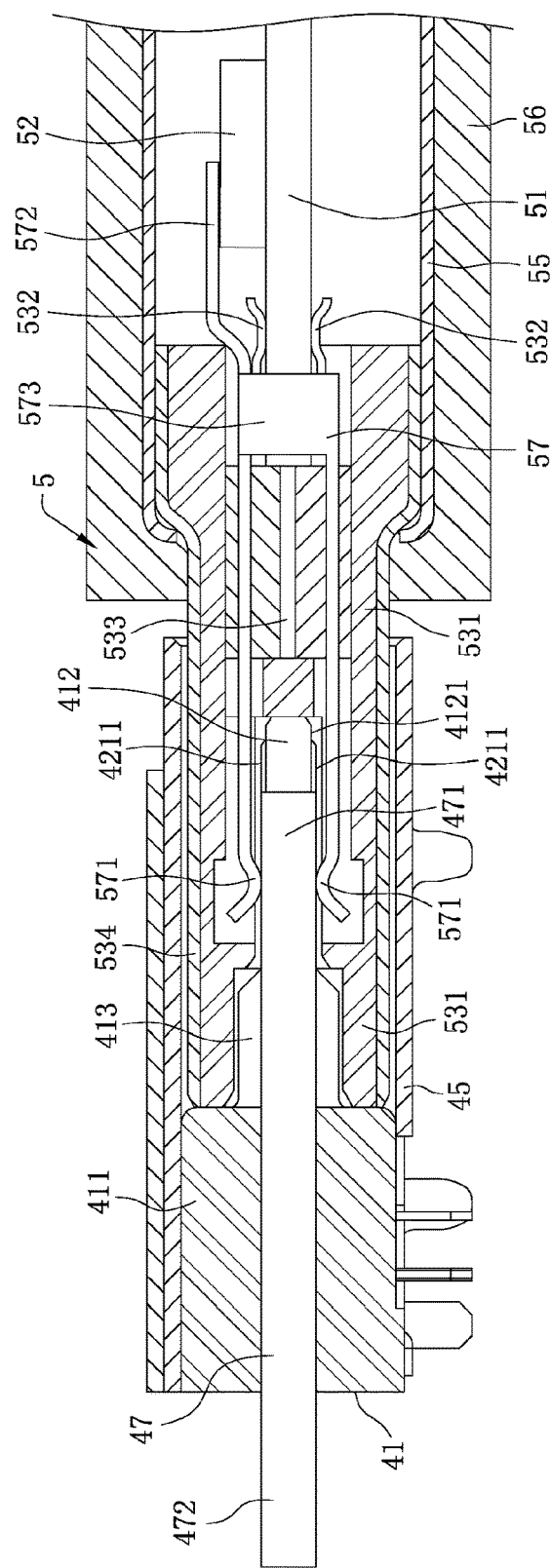
FIG. 9 is a schematic view of a connector assembly according to a fifth embodiment of the present invention.

Referring to FIG. 9, a connector assembly according to a fifth embodiment of the present invention is provided. The structure of the present embodiment is substantially similar to that of the first embodiment described above, and the plug connector 5 and the socket connector 4 may be mated forwardly or reversely. The same structure will not be elaborated again. The difference between the present embodiment and the first embodiment described above exist in that the socket connector 4 may also be an on-board type and is mounted on the main board 2, the plug connector 5 is respectively provided with the two second mating portions 571 vertically provided correspondingly on two sides of the second contact portions 5321. The second mating portion 571 and the second contact portion 5321 have the same elastic contact arm structure, and the first mating portion 471 and the first contact portion 421 have the same flat plate shaped structure. Each first contact portion 421 has a mating surface 4211 exposed from the corresponding first surface 4121, and the mating surface 4211 is configured to be in contact with a corresponding second contact portion 5321. The first thermal conduction member 47 may be made by a powder metallurgy process. The two second mating portions 571 vertically provided correspondingly clamp and elastically abut the same first mating portion 471, and a distance between the two mating surfaces 4211 vertically provided correspondingly is equal to a thickness of the first mating portion 471 in the vertical direction. The two second mating portions 571 vertically provided correspondingly are integrally formed with the same conducting portion 572, and the two second mating portions 571 vertically provided correspondingly are connected to the same connecting portion 573. The connecting portion 573 is substantially "U" shaped. In other embodiments, the two second mating portions 571 vertically provided correspondingly are provided on two second thermal conduction members 57. Of course, the plug connector 5 is provided with the two second mating portions 571 vertically provided correspondingly only on one side of the multiple second contact portions 5321, and the socket connector 4 is correspondingly provided with the first mating portion 471 only on one side of the tongue 412. In addition, the socket connector 4 may be provided with the two first mating portions 471 vertically provided correspondingly on at least one side of the tongue 412. The first mating portion 471 is an elastic contact arm structure. The second mating portion 571 is a flat plate shaped structure. The two first mating portions 471 vertically provided correspondingly clamp and abut the same second mating portion 571, and the two first mating portions 471 vertically provided correspondingly are integrally formed with the same heat dissipating portion 472, or the two first mating portions 471 vertically provided correspondingly are provided on two first thermal conduction members 47.

Figure 10:
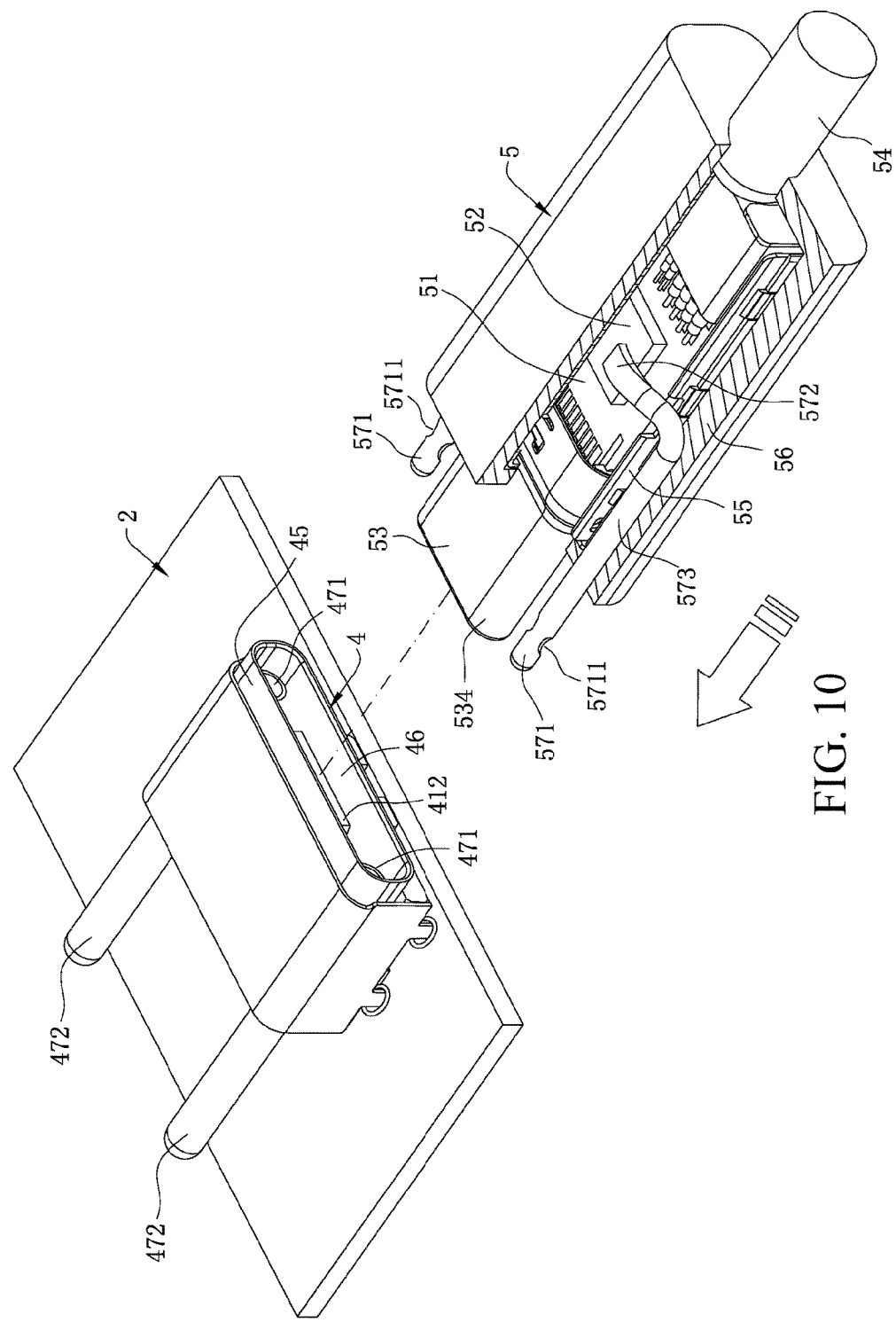
FIG. 10 is a perspective view of a connector assembly according to a sixth embodiment of the present invention before a plug connector is inserted into a socket connector.
Figure 11:
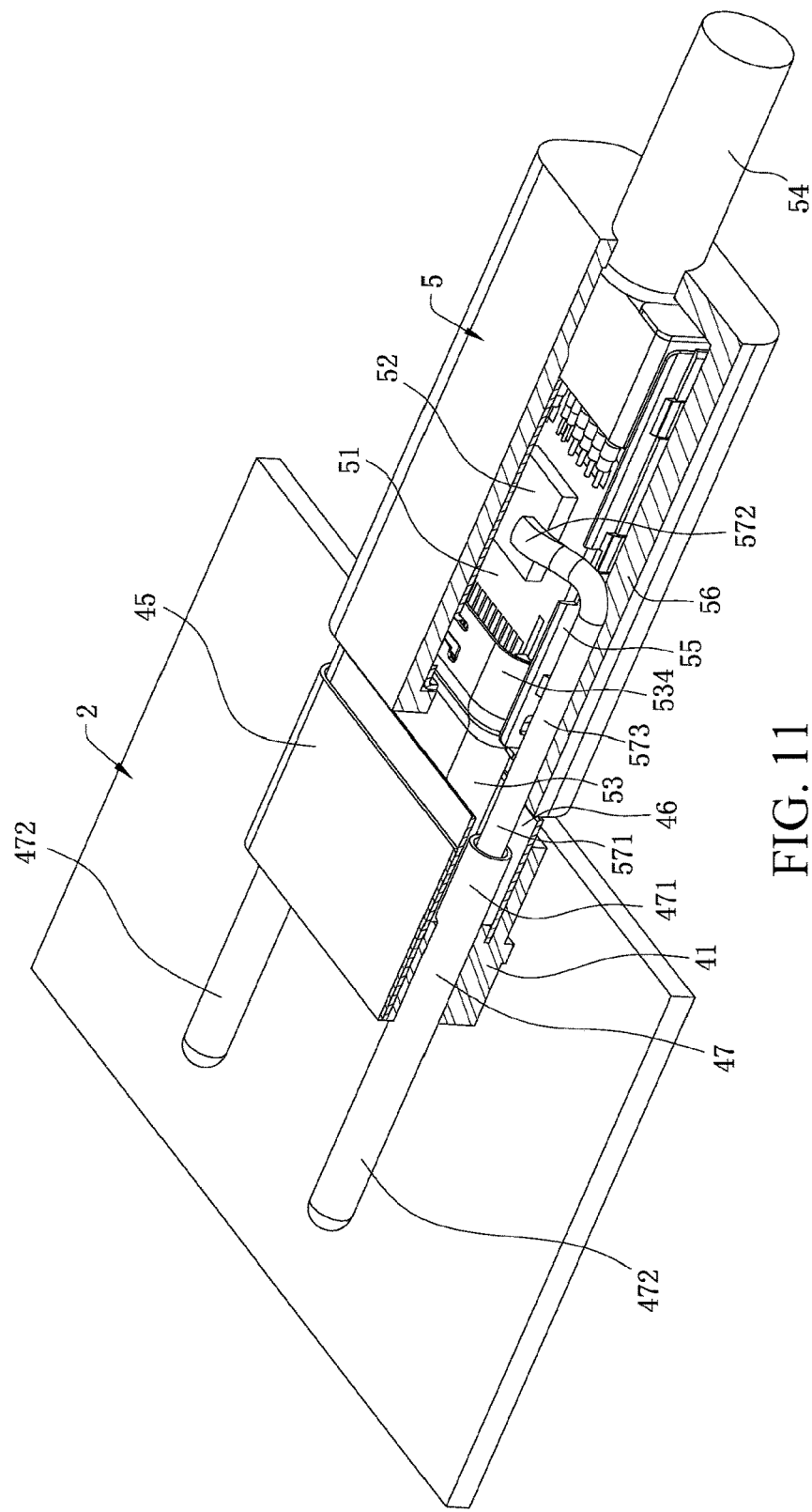
FIG. 11 is a perspective view of FIG. 10 when a plug connector is mated with a socket connector.

Referring to FIG. 10 and FIG. 11, a connector assembly according to a sixth embodiment of the present invention is provided. The structure of the present embodiment is substantially similar to that of the first embodiment described above, and the same structures will not be elaborated again. The difference exists in that the shielding member has two latch arms extending forward from two opposite sides of the body portion. The two latch arms are located at the left and right sides of the insulating body. The second thermal conduction member 57 is substantially "L"-shaped, and a cross-section thereof is circular at all places. The second thermal conduction member 57 is embedded in the insulating shell 56. The second mating portion 571 and the connecting portion 573 both extend in the front-rear direction, and the conducting portion 572 bends for 90 degrees from the connecting portion 573 and extends in the left-right direction. The conducting portion 572 and the connecting portion 573 are both accommodated in the insulating shell 56, and the conducting portion 572 penetrates through the shielding cover 55 to be in contact with the chip 52. The conducting portion 572 may also be in contact with the shielding cover 55, and the second mating portion 571 protrudes forward out of the front end surface of the insulating shell 56. The two second mating portions 571 are located at the left and right sides of the mating joint 53, and the second mating portion 571 and the mating joint 53 are provided at intervals. That is, the second mating portion 571 is located outside the shielding shell 534, and the two second mating portions 571 are symmetrical about the center of the mating slot 5311 at 180 degrees. Thus, the socket connector 4 may be inserted by a composite plug connector 5 in the present embodiment forwardly or reversely, and the socket connector 4 may also be inserted by the plug connector 5 with a standard USB Type-c specification forwardly or reversely. Of course, in other embodiments, there may be multiple chips 52. The chips 52 may be provided on one surface of the circuit board 51, or may be provided on the opposite upper and lower surfaces of the circuit board 51. The two conducting portions 572 may respectively be in contact with different chips 52, and may also be in contact with the same chip 52. At least one of the first thermal conduction member 47 and the second thermal conduction member 57 may selectively be capillaries or thermal transistors. Since a capillary has a small diameter, a capillary bundle formed by multiple capillaries may be used, and both the capillaries and the thermal transistors have favorable thermal conductivity.

To sum up, the connector assembly according to certain embodiments of the present invention has the following beneficial effects:

1. The first contact portions 421 on the first surfaces 4121 of the tongue 412 are arranged in the left-right direction side by side. The shell 45 surrounds the tongue 412 to define the accommodating cavity 46. The first thermal conduction member 47 is provided on the socket connector 4. The first thermal conduction member 47 has the first mating portion 471, and the first mating portion 471 and the tongue 412 are disposed at intervals in the left-right direction. The first mating portion 471 is accommodated in the accommodating cavity 46. The plug connector 5 is provided with the second thermal conduction member 57, and the second thermal conduction member 57 is provided with the second mating portion 571 and the conducting portion 572 thermally conducted with the chip 52 inside the plug connector 5. When the plug connector 5 is inserted into the socket connector 4 in the front-rear direction, the first contact portions 421 are in contact with the conductive terminals 532 to form the electrical connection, and the second mating portion 571 is in contact with the first mating portion 471 to form the thermal conduction. Thus, heat generated by the chip 52 is transferred to the first thermal conduction member 47 through the second thermal conduction member 57, such that the heat generated by the chip 52 can be quickly dissipated from the inside of the plug connector 5.

2. The width of the first mating portion 471 in the left-right direction is twice or more than twice the width of the first contact portion 421 in the left-right direction, and the width of the second mating portion 571 in the left-right direction is twice or more than twice the width of the second contact portion 5321 in the left-right direction. Thus, when the first mating portion 471 and the second mating portion 571 are mated, they may be in contact with each other in a larger area, and the heat obtained by the second thermal conduction member 57 from the chip 52 can be quickly transferred to the first thermal conduction member 47, which accelerates the dissipation of heat inside the plug connector 5.

3. The thickness of the two mating surfaces 4211 vertically provided correspondingly in the vertical direction is equal to the thickness of the first mating portion 471 in the vertical direction. Thus, in the case where the height of the socket connector 4 in the vertical direction is not increased, the first thermal conduction member 47 may be added, and the second mating portion 571 adopts the same elastic arm structure as that of the second contact portion 5321, such that the low-height design of the socket connector 4 is satisfied, and the structure of the plug connector 5 is simplified.

4. The shielding cover 55 is provided with the abutting portion 551 in contact with the chip 52 or the conducting portion 572. Thus, the heat generated by the chip 52 may be transferred through the second thermal conduction member 57, and a part of the heat generated by the chip 52 may be transferred to the shell 45 by the contact between the shielding shell 534 and the shell 45 made of a metal material when the plug connector 5 and the socket connector 4 are mated. The heat dissipating device 3 may also accelerate air flow around the shell 45 to dissipate heat therefrom.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A connector assembly, comprising:
   a socket connector, comprising:
      a main body, having a tongue, wherein the tongue has two first surfaces provided opposite to each other;
      a plurality of mating terminals, provided on the main body,
      wherein each of the mating terminals has a first contact portion, and the first contact portions of the mating terminals are exposed from at least one of the first surface and are arranged in a left-right direction;
      a shell, provided outside the main body, the shell surrounding the tongue to define an accommodating cavity; and
      at least one first thermal conduction member, provided on the main body, wherein the first thermal conduction member has a first mating portion accommodated in the accommodating cavity, and the first mating portion and the tongue are provided at intervals in the left-right direction; and
   a plug connector, comprising:
      a circuit board;
      at least one chip, provided on the circuit board;
      a mating joint, electrically connected to one end of the circuit board, wherein the mating joint has an insulating body and a plurality of conductive terminals provided on the insulating body; and
      at least one second thermal conduction member, provided on the insulating body, wherein the second thermal conduction member has a second mating portion and a conducting portion, and the conducting portion is thermally conducted with the chip,
      wherein when the plug connector is inserted into the socket connector in a front-rear direction, the mating joint is at least partially inserted into the accommodating cavity, the first contact portions of the mating terminals are in contact with the conductive terminal to form an electrical connection, and the first mating portion is in contact with the second mating portion to form thermal conduction.

2. The connector assembly according to claim 1, wherein one of the first mating portion and the second mating portion has an accommodating slot for insertion of the other of the first mating portion and the second mating portion.

3. The connector assembly according to claim 2, wherein the one of the first mating portion and the second mating portion being provided with the accommodating slot also has at least one buckling elastic sheet protruding into the accommodating slot, and the other of the first mating portion and the second mating portion has at least one fastening slot configured to fasten the buckling elastic sheet.

4. The connector assembly according to claim 1, wherein each of the first contact portions and the first mating portion is flat plate shaped, each of the first contact portions has a mating surface configured to be in contact with one of the conductive terminals, and a distance between two of the mating surfaces vertically provided correspondingly is equal to a thickness of the first mating portion in a vertical direction.

5. The connector assembly according to claim 1, wherein the conducting portion protrudes out of a rear end of the insulating body, and is in contact with the chip to form the thermal conduction.

6. The connector assembly according to claim 1, wherein the plug connector is provided with two second mating portions, and the two second mating portions are vertically provided correspondingly and are in contact with the same first mating portion.

7. The connector assembly according to claim 6, wherein the two second mating portions vertically provided correspondingly are integrally formed with the same conducting portion.

8. The connector assembly according to claim 6, wherein the two second mating portions vertically provided correspondingly are provided on two second thermal conduction members.

9. The connector assembly according to claim 1, wherein a mating slot is backward concavely provided on a front end of the insulating body and configured to accommodate the tongue, each of the conductive terminals has a second contact portion, and the second contact portions of the conductive terminals and the second mating portion protrude into the mating slot respectively.

10. The connector assembly according to claim 9, wherein the second contact portions of the conducive terminals are provided in two rows at an upper side and a lower side of the mating slot, the second contact portions are located at one side of the second mating portion in the left-right direction, and the second mating portion is located between the two rows of the second contact portions in a vertical direction.

11. The connector assembly according to claim 9, wherein a front end of the second mating portion is located closer to the front end of the insulating body than a front end of each of the second contact portions.

12. The connector assembly according to claim 9, wherein:
   the plug connector further comprises a latch arm located at a left side or a right side of the mating slot, the latch arm has a latch portion protruding into the mating slot, the second mating portion and the latch portion are located at the left side and the right side of the mating slot; and
   the socket connector further comprises a middle shielding plate located between the two first surfaces, the middle shielding plate has a latch notch exposed from a left side or a right side of the tongue, and the latch portion is configured to be buckled to the latch notch.

13. The connector assembly according to claim 1, wherein the socket connector is provided with two first mating portions respectively at a left side and a right side of the tongue, the two first mating portions are symmetrical about a center of the accommodating cavity at 180 degrees, and the plug connector is correspondingly provided with two second mating portions in contact with the two first mating portions.

14. The connector assembly according to claim 1, wherein the tongue is formed by a printed circuit board (PCB), and each of the first contact portions is an electrical conduction trace on the PCB.

15. The connector assembly according to claim 1, wherein the plug connector further comprises a shielding shell provided outside the insulating body, and the second mating portion is accommodated in the shielding shell.

16. The connector assembly according to claim 15, wherein the plug connector further comprises a shielding cover provided at a rear end of the shielding shell, the circuit board is located in the shielding cover, and the shielding cover has an abutting portion in contact with the chip or the conducting portion.

17. The connector assembly according to claim 1, wherein a width of the first mating portion in the left-right direction is twice or more than twice a width of each of the first contact portions in the left-right direction.

18. The connector assembly according to claim 1, wherein at least one of the first thermal conduction member and the second thermal conduction member is a thermal transistor or a capillary.

19. The connector assembly according to claim 1, wherein the mating terminals are provided in two rows at an upper side and a lower side of the tongue, the conductive terminals are provided in two rows on the insulating body, and each of the rows of mating terminals and each of the rows of conductive terminals respectively comprise, sequentially from left to right: a ground terminal, a pair of differential signal terminals for transmitting universal serial bus (USB) 3.0 signals, a power terminal, a reserved terminal, a pair of USB 2.0 terminals, a reserved terminal, a power terminal, a pair of differential signal terminals for transmitting USB 3.0 signals, and a ground terminal.

20. The connector assembly according to claim 1, wherein the socket connector is mounted on a main board and exposed from one side of a casing, the main board is located in the casing, a heat dissipating device is provided in the casing, the at least one first thermal conduction member has a heat dissipating portion protruding out of the socket connector, and the heat dissipating device is configured for dissipating heat from the heat dissipating portion.

* * * * *